United States Patent
Herman

(10) Patent No.: US 7,719,030 B2
(45) Date of Patent: May 18, 2010

(54) ALUMINUM ALLOYS FOR LOW RESISTANCE, OHMIC CONTACTS TO III-NITRIDE OR COMPOUND SEMICONDUCTOR

(75) Inventor: Thomas Herman, Manhattan Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 48 days.

(21) Appl. No.: 11/692,437

(22) Filed: Mar. 28, 2007

(65) Prior Publication Data

US 2007/0228418 A1 Oct. 4, 2007

Related U.S. Application Data

(60) Provisional application No. 60/786,856, filed on Mar. 29, 2006.

(51) Int. Cl.
*H01L 29/739* (2006.01)
*H01L 31/00* (2006.01)

(52) U.S. Cl. .............................. 257/194; 257/E29.144; 257/E29.253

(58) Field of Classification Search ................. 257/194, 257/788
See application file for complete search history.

(56) References Cited

U.S. PATENT DOCUMENTS

| 5,254,869 A * | 10/1993 | Readdie et al. ............. 257/485 |
| 2003/0006414 A1 * | 1/2003 | Takemura et al. ............. 257/72 |
| 2005/0121673 A1 * | 6/2005 | Satou et al. .................... 257/66 |

* cited by examiner

*Primary Examiner*—Fernando L Toledo
*Assistant Examiner*—Mamadou Diallo
(74) *Attorney, Agent, or Firm*—Farjami & Farjami LLP

(57) ABSTRACT

A low contact resistance ohmic contact for a III-Nitride or compound semiconductor wafer or die consists of 4 layers of Ti, AlSi, Ti and TiW. The AlSi has about 1% Si. The layers are sequentially deposited as by sputtering, are patterned and plasma etched and then annealed in a rapid thermal anneal process. The use of AlSi in place of pure Al reduces contact resistance by about 15% to 30%.

11 Claims, 2 Drawing Sheets

ALUMINUM ALLOYS FOR LOW RESISTANCE, OHMIC CONTACTS TO III-NITRIDE OR COMPOUND SEMICONDUCTOR

RELATED APPLICATIONS

This application claims the benefit of U.S. Provisional Application No. 60/786,856, filed Mar. 29, 2006, the entire disclosure of which is incorporated by reference herein.

FIELD OF THE INVENTION

This invention relates to an ohmic contact for III-Nitride devices or compound semiconductor devices, both herein referred to as III-Nitride devices.

BACKGROUND OF THE INVENTION

Ohmic contact stacks employing a pure Al layer are commonly used as ohmic contacts to the surface of a III-Nitride or GaN based semiconductor device. Such contact structures are described, for example, in:

Microstructure of Ti—Al Ohmic contacts for n-Al GaN, Applied Physicals Letters 73, 2582 (1998), and Low Resistance Si—Ti—Al—Ni—Au Multilayer Ohmic Contact to Undoped AlGaN—GaN, Electrochemical and Solid-State Letters, 7 (4) G72-G74 (2004).

It is desired to have a very low contact resistance. Contact resistance ($R_c$) is often described by its Specific Contact Resistivity, (SCR) in units of ohm-cm$^2$; or by its Specific Linear Contact Resistivity (SLCR) in units of ohm-mm. SCR and SLCR are nominally independent of the geometry of the contact. The total contact resistance of a given contact may be expressed as:

1. $R_c$=SCR/contact area, or
2. $R_c$=SLCR/Contact Width, where contact width is the direction perpendicular to current flow. SCR and SLCR are often measured by special test structures using methods known as the Transmission Line Method (TLM) or Van de Pauw Method (VDP).

Typical ohmic contacts to AlGaN employ metal stacks of pure films such as Ti/Al/Ni/Au or Ti/Al/Ti/TiW. (Conventionally film stacks are listed in the sequence in which they are deposited so that the first metal film listed is the first to be deposited on the semiconductor surface.)

The electrical resistance of the metal to semiconductor contact is a critical process and design parameter for achieving a low $R_{dson}$ (on-state resistance) and high current-carrying capability of a transistor of other device being formed. This is especially true of III-Nitride semiconductors where the specific contact resistance SCR to an AlGaN surface can be 10s to 100s times that in silicon technology.

Thus, III-Nitride contact resistance depends on complex and, often, poorly understood interactions between the metalization layers, the composition of the semiconductor surface, the semiconductor surface properties and treatments, and annealing conditions.

BRIEF SUMMARY OF THE INVENTION

In accordance with the invention, it has been found that the use of an aluminum-silicon alloy in place of the conventionally used pure aluminum film in a contact stack produces a contact resistance reduction of 10% to 30%. The AlSi alloy preferably has a silicon content of about 1%.

The stack may be Ti/AlSi/Ti/TiW. Other metals may be used for the first, third and fourth layers. The metal films may be sequentially sputter deposited, patterned and plasma etched, and then annealed by a rapid thermal anneal process (RTA) at about 875° C. for 60 seconds in nitrogen gas.

Figure 1:
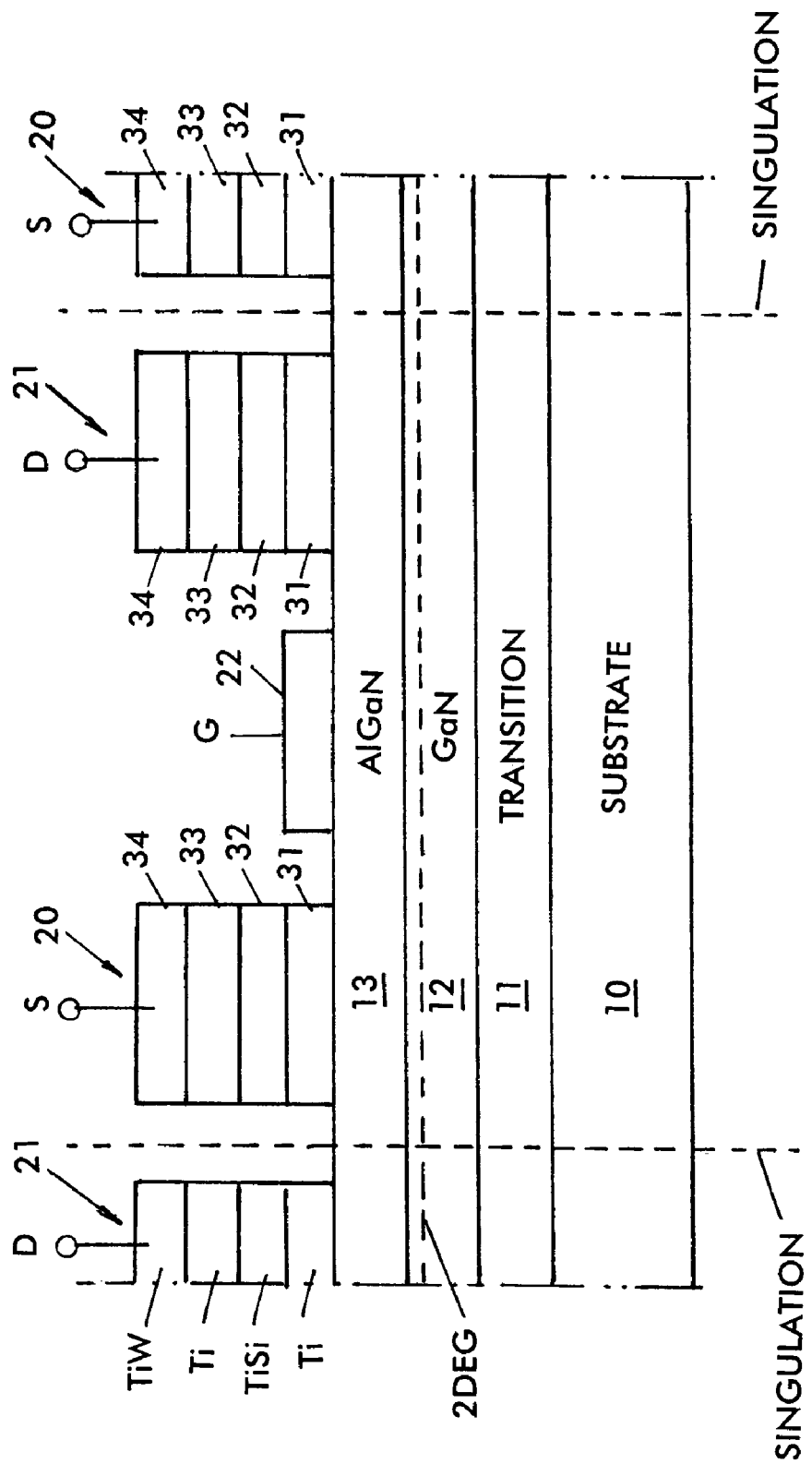
FIG. 1 is a cross-section of a III-Nitride device employing the novel contact stack of the invention.

Referring first to FIG. 1, there is shown a III-Nitride transistor in cross-section, comprising a substrate 10 which may be silicon or some other well known substrate material; a transition layer 11 atop the substrate 10; a GaN layer 12 atop the transition layer 11 and an AlGaN layer 13 atop the GaN layer 12. The transition layer 11 is employed to match the thermal and mechanical characteristics of AlGaN layer 13 to those of substrate 10. As is well known, and the boundary between AlGaN layer 13 and GaN layer 12 form a 2 DEG conduction layer. The composition of layers 12 and 13 can be modified as desired.

It is necessary to make ohmic contacts to the surface of AlGaN layer 13 for a source contact 20 and drain contact 21. A gate contact 22, shown as a Schottky contact is also used. The contact pattern shown can repeat over the surface of AlGaN layer 13, with the individual devices subsequently separated along singulation lines. Note that all dimensions have been exaggerated for clarity.

The contacts 20, 21 in prior art devices have been formed of 4 sequentially deposited films or layers of pure metals. For example, layers 31, 32, 33 and 34 have been pure metals films of Ti/Al/Ni/An or Ti/Al/Ti/TiW; or Ti/Al/Ti/TiW or the like.

Figure 2:
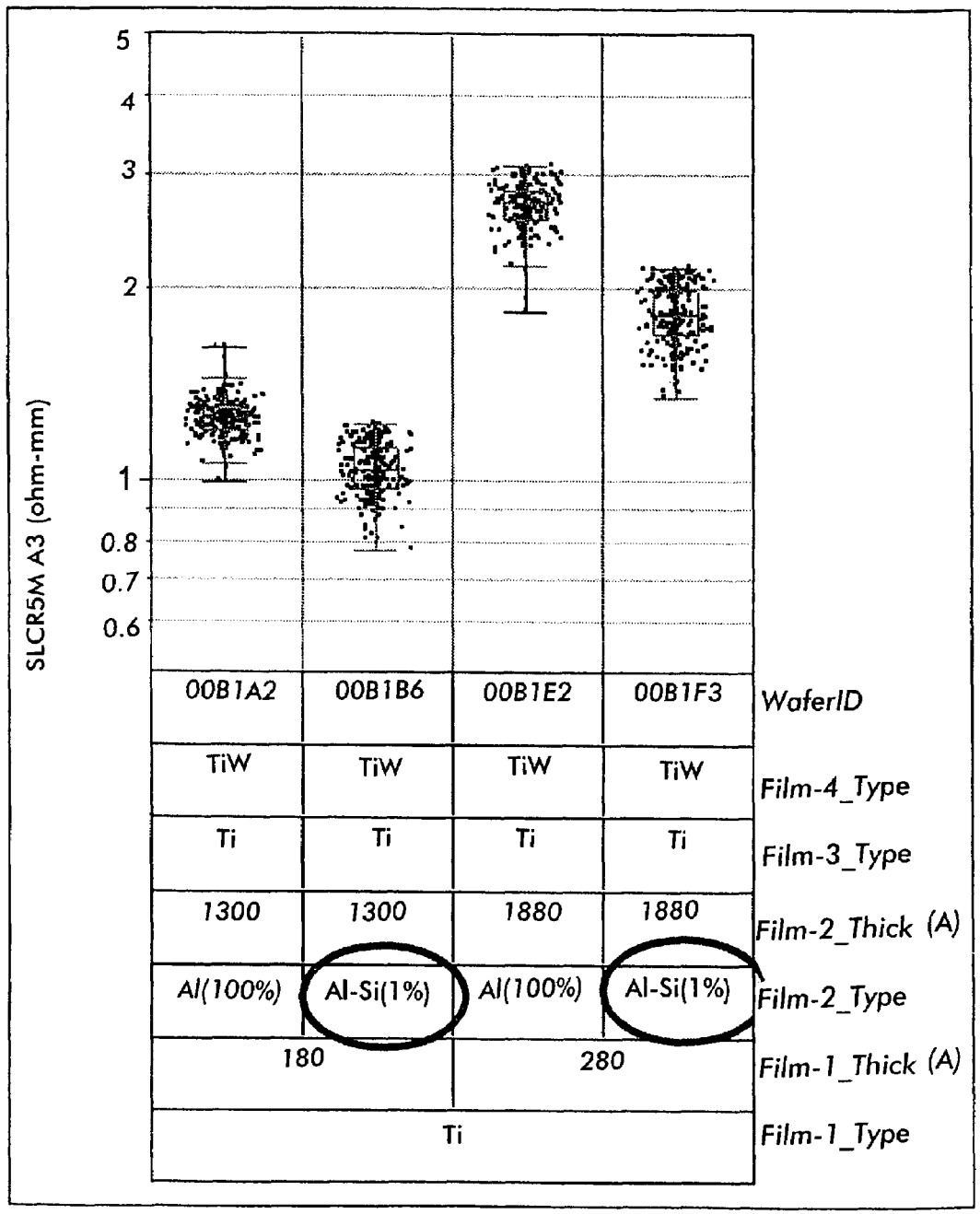
FIG. 2 is a chart showing two embodiments of the invention, for plural devices in a wafer lot compared to respective prior art structures, and showing the reduced SLCR obtained when the prior art pure Al layer is replaced by an Al Si alloy layer.

It has been found, in accordance with the invention, that replacing the pure Al layer by an alloy of AlSi with about 1% Si reduces contact resistance to the AlGaN layer 13 by 15% to 30%, as shown in FIG. 2.

More specifically, and as shown in FIG. 1, metal films 31 to 34 comprise Ti/TiSi/Ti/TW films which are sequentially sputter-deposited, patterned and plasma etched and then thermally annealed in a rapid thermal anneal process at a nominal 875° C. for 60 seconds in nitrogen gas. The film 32 may be sputter-deposited from a monolithic Aluminum-silicon target. Co-deposition simultaneous or sequential) deposition from separate Al and Si targets may also be used. CVD, electron beam and other deposition methods may also be used.

In a first embodiment, shown in the second bar from the left in FIG. 2, Ti layer 31 is 180 Å thick; AlSi(1%) layer 32 is 1300 Å thick; Ti layer 33 is 600 Å thick and TiW layer (90% W) is 610 Å thick. The measured SLCR of several 10s of devices in a wafer lot (each represented by a dot) of the stack is shown at the top of the bar in FIG. 2 with, the measurements centered around an SLCR of about 1 ohm-mm.

This is to be compared to an equivalent prior art stack shown in the first bar at the left of FIG. 2 in which the second layer is pure Al, all other things being equal with the SLCR measurements centered around about 1.3 ohm-mm.

In a second embodiment of the invention, shown in the right hand bar of FIG. 2, the Ti layer 31 was increased to 280 Å and AlSi (1%) layer 32 was increased to 1880 Å. The Ti film 33 and TiW film 34 were 600 Å and 610 Å respectively.

(Layers 33 and 34 could be replaced by other metals, for example, Ni and Au respectively.)

The second embodiment of the right hand bar should be compared to the prior art bar second from the right, using pure Al for the second film of the stack. Thus, the SLCR of the stack with a pure Al film 1880 Å thick is centered around about 2.7 ohm-mm while the replacement of AlSi(1%) reduces the SLCR to a value centered around about 1.8 ohm-mm.

It should be noted that while AlSi has produced substantial contact resistance reduction, that other alloy combinations, for example, AlSiTi may also be used.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. An ohmic metal contact stack for forming a power electrode of a III-Nitride semiconductor device; said ohmic contact stack comprising a stack of at least 4 metal layers of diverse materials sequentially deposited atop a III-Nitride surface portion of said III-Nitride semiconductor device; wherein at least one of said layers comprises Al and Si and at least another one of said layers comprises TiW.

2. The stack of claim 1, wherein said at least one of said layers comprises about 99% Al and 1% Si.

3. The stack of claim 1, wherein said one of said layers is the second layer of said stack.

4. The stack of claim 1, wherein said AlSi film is from about 1300 Å to about 1800 Å thick.

5. The stack of claim 2, wherein said AlSi film is from about 1300 Å to about 1800 Å thick.

6. An ohmic metal contact stack configured for use in a III-Nitride high electron mobility transistor (HEMT), said ohmic metal contact stack comprising:

a stack of at least 4 metal layers of diverse materials sequentially deposited over a heterojunction of said III-Nitride HEMT;

at least one of said at least 4 metal layers comprising an alloy of Al and Si;

said stack of at least 4 metal layers making ohmic contact with said III-Nitride heterojunction.

7. The ohmic metal contact stack of claim 6, wherein said at least one of said at least 4 metal layers comprises about 99% Al and 1% Si.

8. The ohmic metal contact stack of claim 6, wherein said at least one of said at least 4 metal layers is the second layer of said stack of at least 4 metal layers.

9. The ohmic metal contact stack of claim 6, wherein said at least one of said at least 4 metal layers is less than 2000 Å thick.

10. The ohmic metal contact stack of claim 6, wherein said at least one of said at least 4 metal layers is from about 1300 Å to about 1800 Å thick.

11. The ohmic metal contact stack of claim 6, wherein said III-Nitride heterojunction is formed by an interface of a gallium nitride (GaN) layer and an aluminum gallium nitride (AlGaN) layer with which said stack of at least 4 metal layers is in ohmic contact.

* * * * *

UNITED STATES PATENT AND TRADEMARK OFFICE
CERTIFICATE OF CORRECTION

| | |
|---|---|
| PATENT NO. | : 7,719,030 B2 |
| APPLICATION NO. | : 11/692437 |
| DATED | : May 18, 2010 |
| INVENTOR(S) | : Herman |

Page 1 of 1

It is certified that error appears in the above-identified patent and that said Letters Patent is hereby corrected as shown below:

In the claims, column 4, line 21, "Åthick" should be changed to --Å thick--.

Signed and Sealed this
Twenty-second Day of November, 2011

David J. Kappos
*Director of the United States Patent and Trademark Office*